United States Patent [19]
Shusa et al.

[11] Patent Number: 6,002,587
[45] Date of Patent: *Dec. 14, 1999

[54] HOUSING OF INFORMATION PROCESSING APPARATUS

[75] Inventors: Munenori Shusa, Yokohama; Tetsuo Kikuchi, Ayase, both of Japan

[73] Assignee: Canon Kabushiki Kaisha, Toyko, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/660,419

[22] Filed: Jun. 7, 1996

[30] Foreign Application Priority Data

Jun. 16, 1995 [JP] Japan ..................................... 7-150278

[51] Int. Cl.⁶ ..................................................... H05K 7/20
[52] U.S. Cl. ............................ 361/704; 361/690; 361/809
[58] Field of Search ............................ 361/600, 687–690, 361/704, 707, 719, 720, 725, 727, 730, 736, 752, 759, 785, 796, 803, 807, 809

[56] References Cited

U.S. PATENT DOCUMENTS

| | | |
|---|---|---|
| 4,821,150 | 4/1989 | Duthie et al. ............................. 361/796 |
| 4,920,453 | 4/1990 | Onose et al. ............................. 361/736 |
| 5,027,254 | 6/1991 | Corfits et al. ............................ 361/796 |
| 5,424,913 | 6/1995 | Swindler .................................. 361/687 |
| 5,457,643 | 10/1995 | Vahey et al. .......................... 364/708.1 |
| 5,615,085 | 3/1997 | Wakabayashi et al. ................. 361/688 |

*Primary Examiner*—Gregory Thompson
*Attorney, Agent, or Firm*—Fitzpatrick, Cella, Harper & Scinto

[57] ABSTRACT

A housing of an electronic apparatus such as an information processing apparatus has a first board has arranged in a casing and has a first connector, and a second board with a second connector adapted to be fitted to the first connector. The second connector forms at least a part of the casing and is fixed to a conductive cover that is detachable from the casing. A heat generating member is detachably attached to the second board. The cover can be made of a metal in contact with the heat generating member through a heat conduction elastomer.

20 Claims, 6 Drawing Sheets

HOUSING OF INFORMATION PROCESSING APPARATUS

BACKGROUND OF THE INVENTION

1. Field of the Invention

The invention relates to an information processing apparatus and, more particularly, to an information processing apparatus in which by removing a cover constructing a part or all of a housing, a CPU or a board (CPU board) on which the CPU is arranged can be removed.

2. Related Background Art

In recent years, in association with the progress of the techniques, computers are being rapidly developed. Particularly, a CPU chip as a heart of the computer is being progressed everyday. Therefore, the computer maker rapidly makes a commercially available product of an apparatus using a latest CPU chip and is vigorously competing. Such a competition also largely contributes to not only a compatibility of the improvement of the performance of the computer and the reduction of the costs but also an enlargement of spread. On the contrary, a speed of generation exchange of the CPU chip rises. When seeing from the user side, there is also a fact that it is impossible to ignore the occurrence of a situation such that the product becomes an old type just after the user bought it.

Among the conventional apparatuses, therefore, there is an apparatus with a design such that in the case where the performance of the CPU of the apparatus which the user bought seems to be inferior to the latest CPU, the CPU chip sole body or one board (CPU board) on which the CPU chip and peripheral parts are attached can be exchanged. As examples of the mechanical structures of those apparatuses, there is a structure such that a cover (lid) is provided for a housing so that the CPU chip or CPU board can be easily removed and, by opening the cover, the CPU chip or CPU board can be grasped by the hand, a structure such that the whole housing can be removed and the CPU chip or CPU board are arranged in portions such that they can be easily grasped by the hand by removing the housing, and the like.

In such a conventional structure, the CPU chip or CPU board is connected to a main board fixed in the apparatus main body by fitting members such as connectors or the like. When removing, operations such that an arbitrary portion of the CPU chip or CPU board is grasped by the hand and the fitted connectors are pulled out while swinging it are executed.

Therefore, there are problems such that a dynamical load in the irregular direction due to the swinging motion is also applied in the direction other than the load direction that is optimum to pull out the connectors, a breakage of the connectors or the like occurs, a defective connection is caused, the CPU board is deformed, a pattern is broken, and the like.

SUMMARY OF THE INVENTION

It is an object of the invention that, in an information processing apparatus in which a CPU or a CPU board can be exchanged by removing a cover constructing a part of or an entire housing, the direction of dynamical loads which are applied to connectors and their peripheral portions upon exchange is stabilized and a heat radiation of the CPU is efficiently executed.

The invention is realized by: a first board which is arranged in a casing and has a first connector; and a second board which has a second connector adapted to be fitted to the first connector and forms at least a part of the casing and is fixed to a cover that is detachable to/from the casing.

DETAILED DESCRIPTION OF THE PREFERRED EMBODIMENTS

An apparatus according to an embodiment of the invention will now be described in detail hereinbelow with reference to the drawings.

Figure 1:
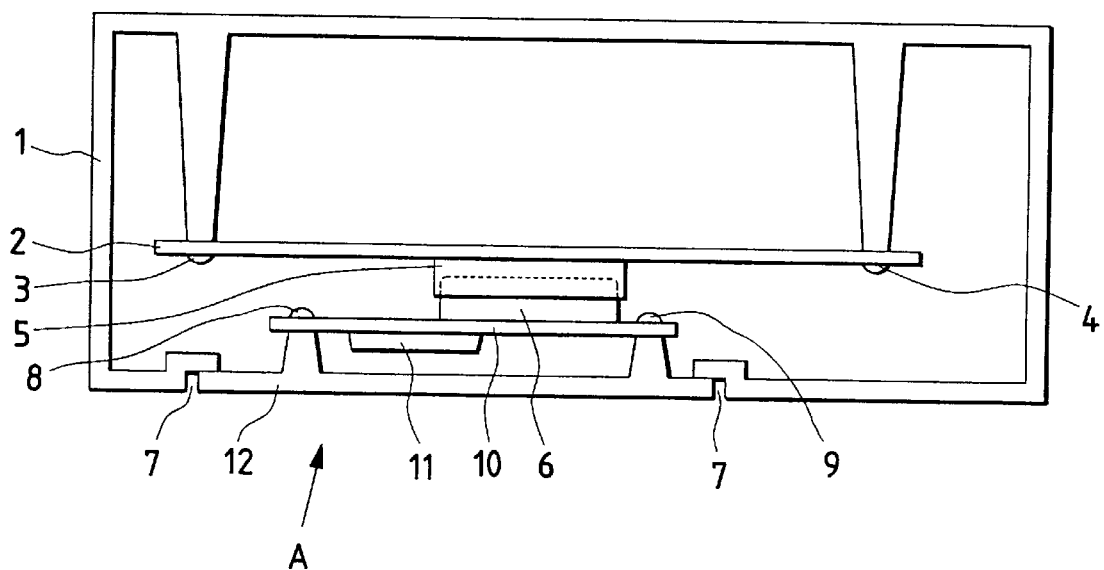
FIG. 1 is a cross sectional view of an apparatus of an embodiment 1 of the invention.
Figure 2:
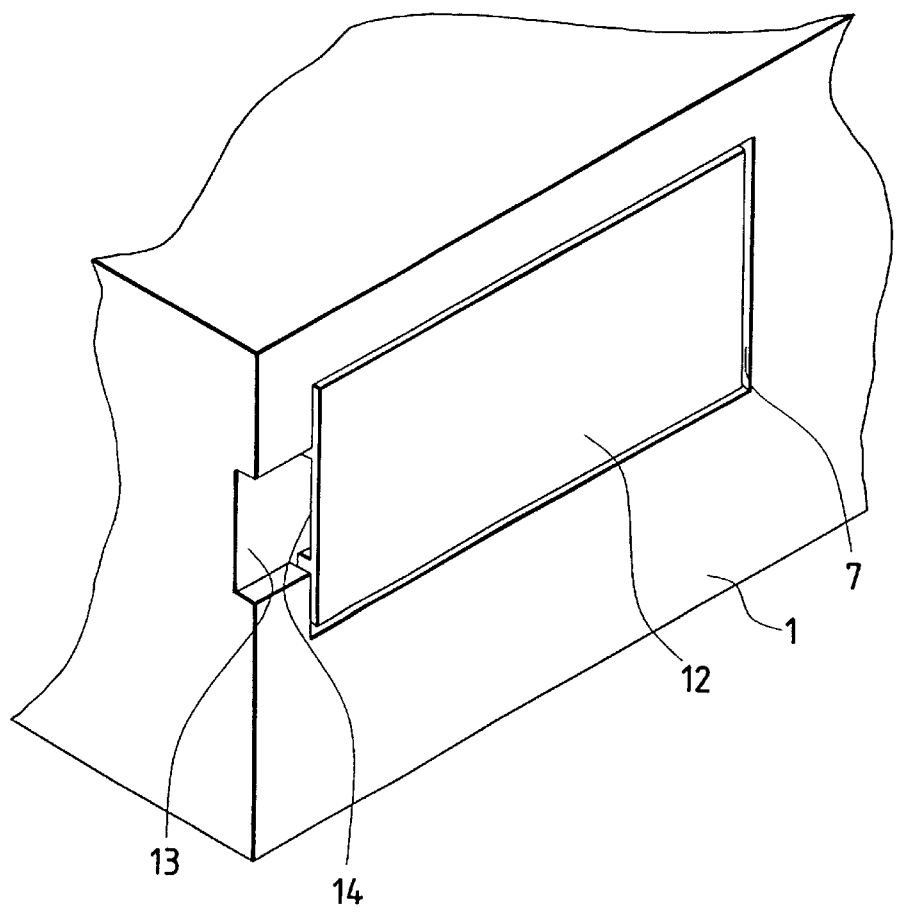
FIG. 2 is a perspective view of FIG. 1 when it is seen from the direction shown by an arrow A.

FIG. 1 is a schematic cross sectional diagram of the apparatus of the embodiment of the invention. FIG. 2 is a perspective view of FIG. 1 when it is seen from the direction shown by an arrow A. Reference numeral 1 denotes a housing of the apparatus. A main board 2 is fixed to the housing 1 with screws 3 and 4. A connector 5 is attached to the main board 2 by soldering. A CPU board 10 is fixed to a cover 12 with screws 8 and 9. A connector 6 and a CPU chip 11 are attached to the CPU board 10 by soldering. When the connectors 5 and 6 are fitted, as shown in FIGS. 1 and 2, one surface of the cover 12 becomes the same surface as the housing 1, thereby constructing a part of the housing 1. Various ICs and the like which are necessary for the operation of the apparatus are installed on the main board 2 and are electrically connected to the CPU chip 11, thereby realizing various functions. Since the housing 1 and cover 12 have a detachable structure, it is necessary to assure an easiness of the attaching/detaching operation. For this purpose, a gap 7 is formed between them. At the same time, in order to make it impossible to easily hook an arbitrary peripheral location of the cover 12 by a finger or a tool and to remove the cover 12, the gap 7 is set to about a value of 0.5 to 1.0 mm, thereby preventing that the finger or tool enters the gap. For the connectors, such a construction prevents that a force is applied from the direction other than the pulling-out direction in which a dynamical load is small and the cover 12 is removed.

For the connectors, therefore, in order to enable the cover 12 to be removed from the optimum direction, a cover opening groove 13 on the housing side and a cover opening groove 14 are formed in portions shown in FIG. 2. A state when the cover 12 is removed by the housing side cover opening groove 13 and cover opening groove 14 is shown in the diagrams.

Figure 3:
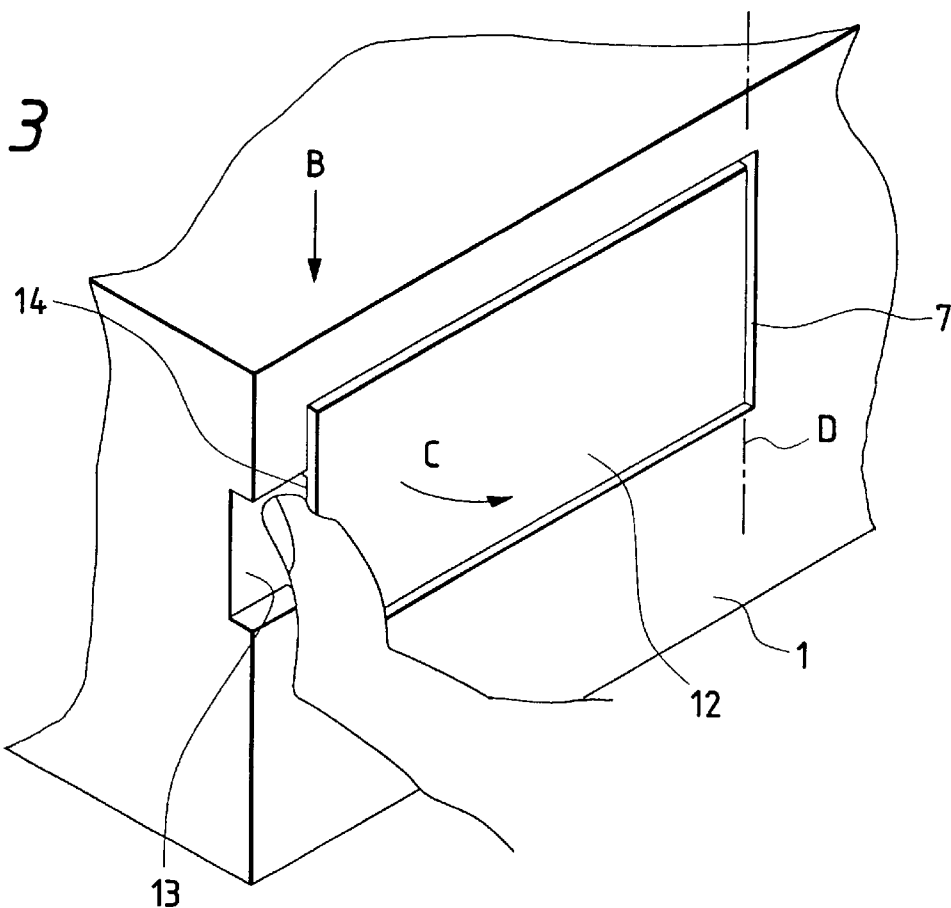
FIG. 3 is a diagram showing a state in which the thumb of the right hand is hooked to the apparatus of FIG. 2.
Figure 4:
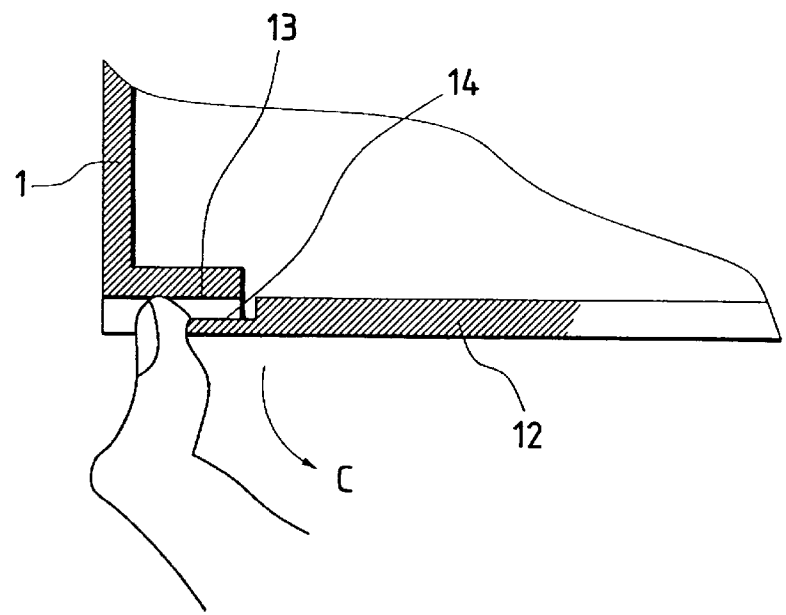
FIG. 4 is a partial enlarged cross sectional view of FIG. 3 when it is seen from the same direction as that in FIG. 1.
Figure 5:
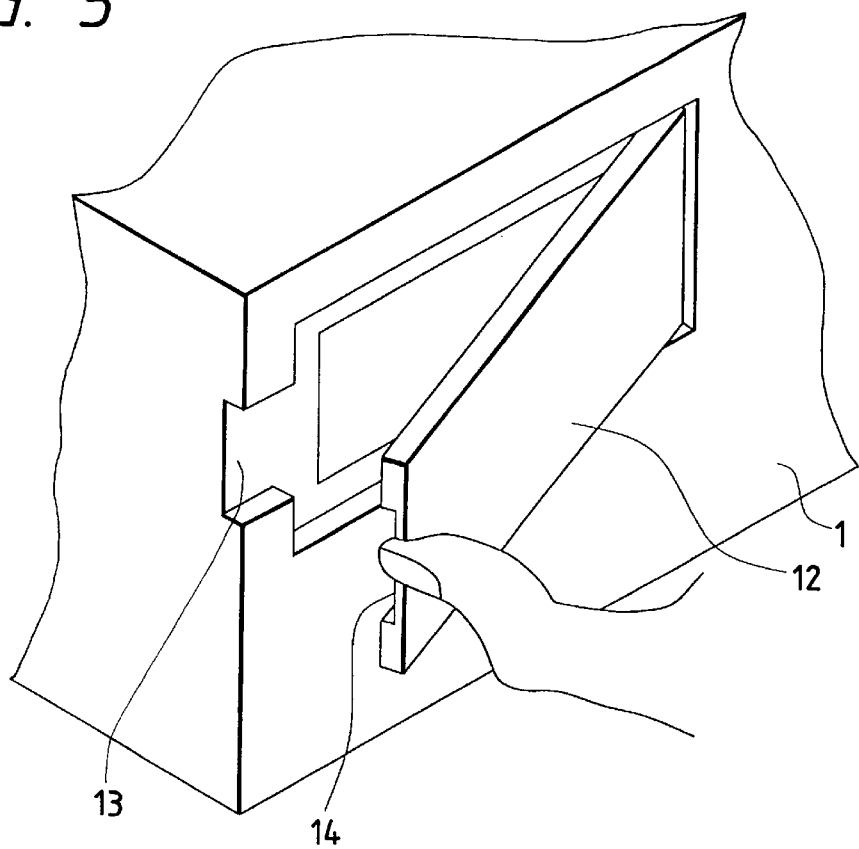
FIG. 5 is a diagram showing a state in which a cover is removed from the apparatus of FIG. 3.
Figure 6:
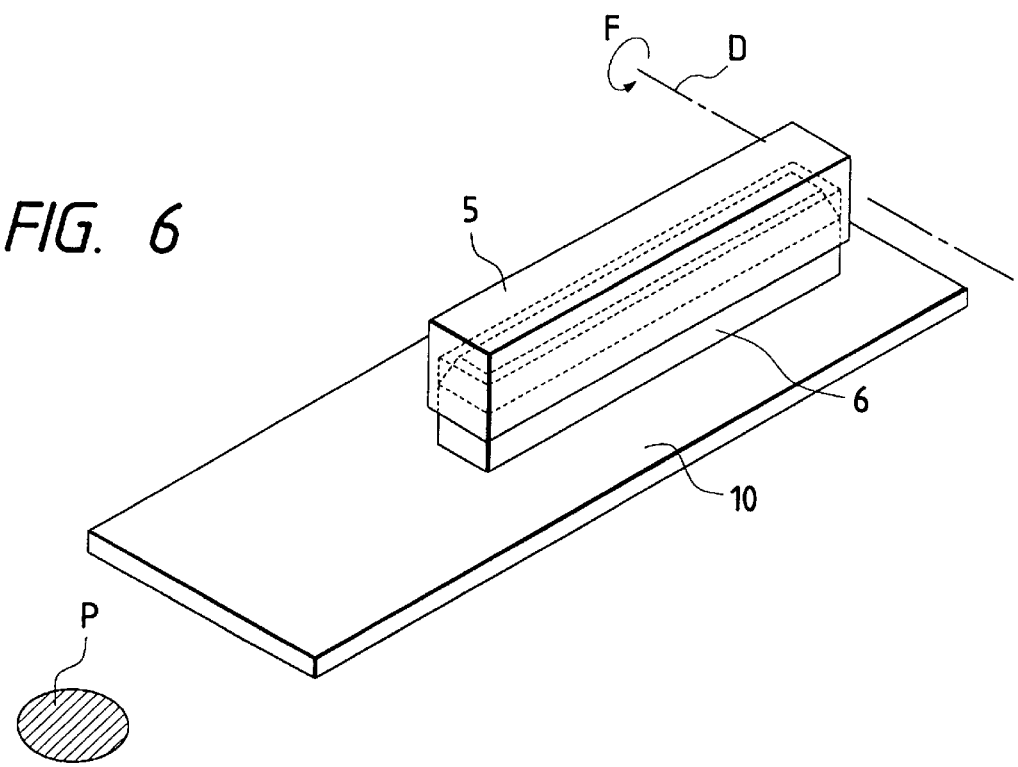
FIG. 6 is a perspective view showing a state of a CPU board and a connector.
Figure 7:
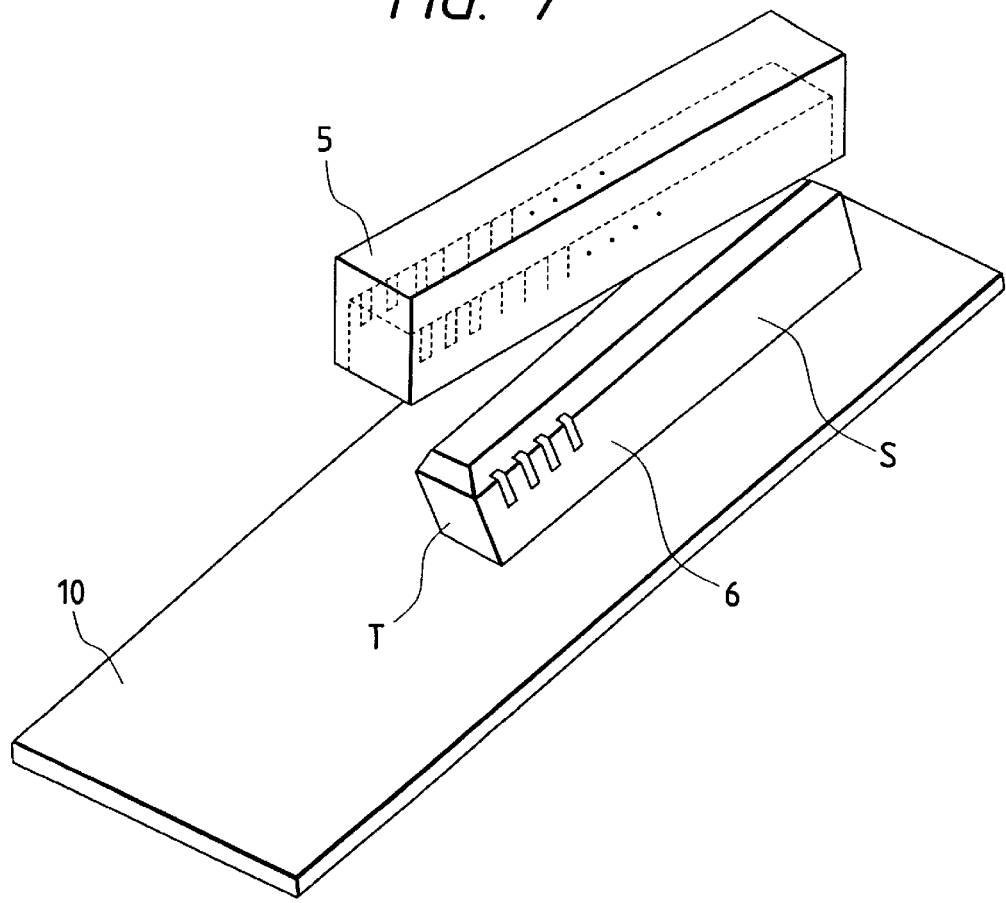
FIG. 7 is a diagram showing the state of FIG. 5 by visual points and elements in FIG. 6.

FIG. 3 shows a state in which the thumb of the right hand is hooked to the housing side cover opening groove 13 and cover opening groove 14 in FIG. 2. FIG. 4 is a cross sectional view of the state of FIG. 3 when it is seen from the direction shown by an arrow B. As shown in the diagrams, by hooking the thumb of the right hand to the housing side cover opening groove 13 and by lifting up the finger toward the cover 12, a tip portion of the finger is deformed and slightly enters the gap between the housing 1 and the cover 12 that is formed by the cover opening groove 14, so that the finger is hooked to the cover 12. When the finger is hooked to the cover 12, by applying a force by the finger in the direction shown by an arrow C, the cover 12 rotates around a rotary axis shown by an alternate long and short dash line D. The apparatus changes from the state of FIG. 3 to the state of FIG. 5, the cover 12 is opened, the connectors 5 and 6 are detached at the same time, and the cover 12 can be removed from the apparatus main body in one direction. A state in which the connectors 5 and 6 are detached in this instance will now be described with reference to the drawings. The state of the connectors in FIG. 3 is as shown in FIG. 6. The state of the connectors in FIG. 5 is as shown in FIG. 7. In the above series of motions, the connector 6 is removed from the connector 5 by the motion in the surface on a major side S in the two kinds of fitting surfaces (major side S and minor side T). Therefore, a dynamical load in the direction other than the direction necessary for the connector to be removed is not applied to a joint portion of the connector and the board and to the connector itself. The connector 6 is rotated in the direction shown by an arrow F around almost the alternate long and short dash line D as a rotary axis. However, a force point at which the finger applies a force to open the cover 12 in this instance is located near a P region on FIG. 6 and is away from the rotary axis than the fitting surface of the connector serving as an operating point. Thus, the force to be applied by the finger can be reduced due to the principle of the moment as compared with the case of removing the connector while grasping and swinging a portion near the connector.

Figure 10:
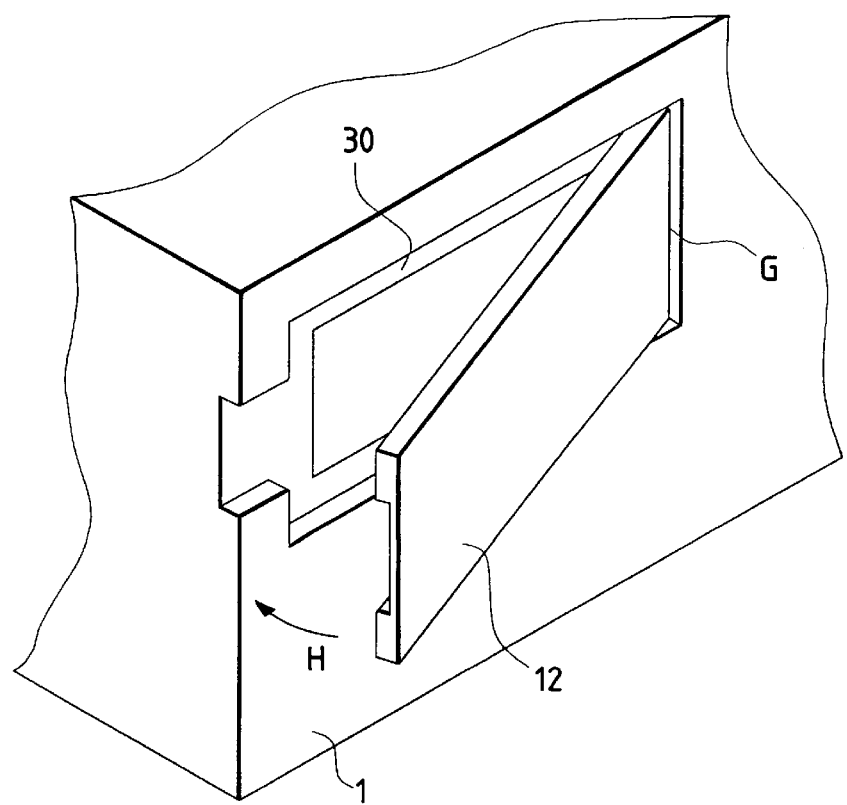
FIG. 10 is a perspective view showing a state in which a cover is attached when it is seen from the same direction as that in FIG. 5.

When the removed cover 12 and CPU board 10 are again attached, as shown in FIG. 10 (perspective view when it is seen from the same visual line as that of FIG. 5), a minor side G of the cover 12 is guided to the wall on the inner side of an outer peripheral portion of a cover attaching concave portion 30 of the housing 1, the minor side C is used as a rotary axis, and the cover 12 is rotated in the direction shown by an arrow H. In this instance, the cover 12 has dimensions which are smaller than the cover attaching concave portion 30 by the gap 7 in the front/rear and right/left directions by 0.5 to 1.0 mm, respectively. A same positional deviation of the connectors occurs in the front/rear and right/left directions, respectively, when the cover 12 approaches the housing 1 and the connectors 5 and 6 are being fitted. As shown in FIG. 6 and the like, however, since the connector 6 is chamfered by about 1 mm, even if there is a positional deviation by the gap 7, the connector 5 can pull in the connector 6. Both of the connectors 5 and 6 are fitted and the cover 12 and CPU board 10 are attached to the housing 1.

Another embodiment will now be described in detail with reference to the drawings.

In the embodiment 1 of the invention, the CPU chip 11 is fixed to the CPU board 10. The high performance and high speed of the CPU chip are being realized due to the recent progress of techniques. In addition, the heat generation is also increasing more and more. Therefore, the heat radiation from the chip has to be promoted and problems with the chip due to high heat have to be prevented. As a countermeasure for those problems, there is considered a method whereby the cover to which the CPU board is fixed is made of a metal and the CPU chip is in contact with the metal cover, thereby also using the cover as a heat radiating plate. In this case, both the cover and the chip are hard objects and even if it is intended that they directly come into contact with each other, a gap occurs due to an error which is caused because of the attaching dimensions. There are, consequently, problems such that they cannot come into contact or, on the contrary, a dynamical load is applied to the CPU board due to an over-contact, and the like. Therefore, a device made of a rubber sheet-like substance as a soft elastic member having a high heat conduction such as heat conduction elastomer is sandwiched between the chip and the cover, the dimensional error is absorbed by an elastic deformation of the heat conduction elastomer, and they come into contact with each other. With this method, a heat conduction from the chip to the cover is accomplished without being anxious about the error of the attaching dimensions, and the heat radiation from a wide area is realized.

Figure 8:
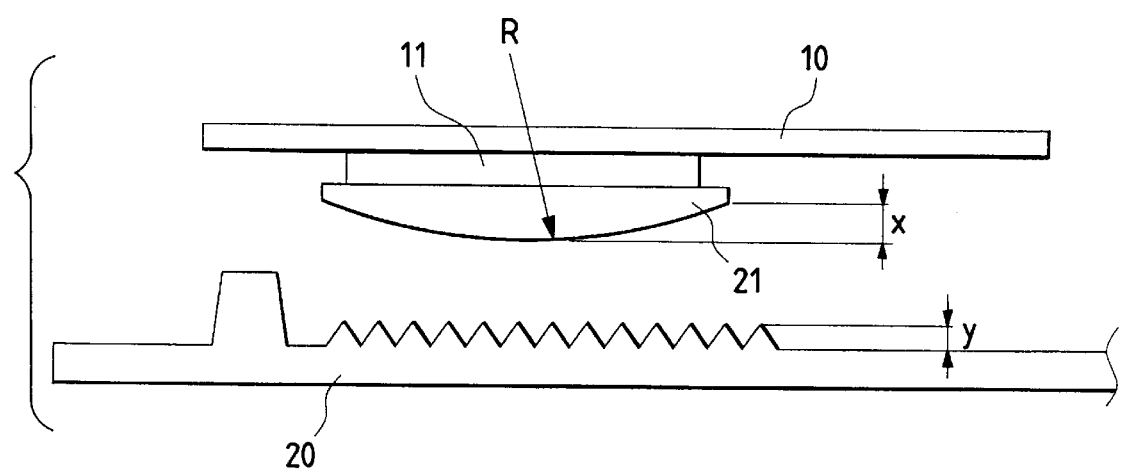
FIG. 8 is a partial enlarged diagram of a cross section of an apparatus according to an embodiment 2 of the invention.

In the above method, in order to further reduce the influence on the CPU board by the dynamical load which is caused by the elastic deformation of the heat conduction elastomer, according to the invention, as shown in FIG. 8 (cross sectional view when it is seen from the same direction as that in FIG. 1), a heat conduction elastomer 21 having a semi-spherical cross sectional shape of a radius R is sandwiched between a cover 20 made of a metal having a cross section of a mountain-like concave/convex shape and the CPU chip 11, thereby allowing them to be come into contact with each other.

Figure 9:
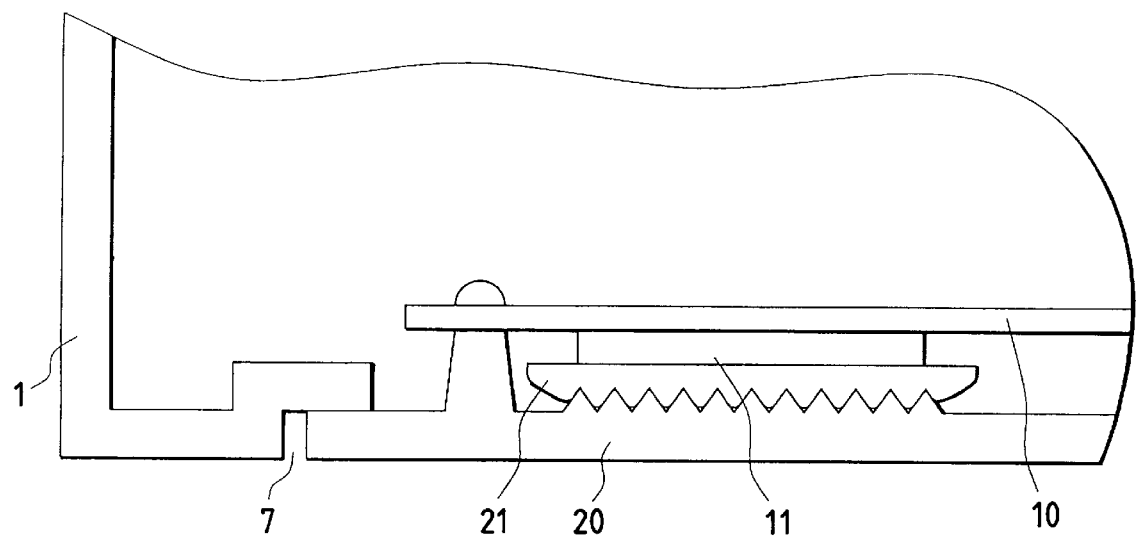
FIG. 9 is a partial enlarged diagram of the cross section of the apparatus of the embodiment 2 of the invention.

As shown in FIG. 9, as for a depth of contact when they are combined, by setting the positional relation among the CPU chip 11, metal cover 20, and heat conduction elastomer 21 so as to certainly cause an error in the adhering direction, the CPU chip 11, metal cover 20, and heat conduction elastomer 21 are not away from each other but transfer the heat from the CPU chip 11 to the metal cover 20. At this time, since the deformation due to the crush of the heat conduction elastomer 21 is certainly spread from the center of the semispherical shape of the radius R to the periphery, an air layer existing between the metal cover 20 and the heat conduction elastomer 21 is pushed out to the outside. When they are combined, the air is hard to remain. The above construction is advantageous in terms of the heat conduction. Since the metal cover 20 side as a hard object has a concave/convex shape, the surface area in which the heat is propagated is enlarged (a situation such that the metal cover 20 is deformed and the area decreases doesn't occur). Moreover, the heat conduction elastomer 21 is also deformed so as to enter the concave portion of the mountain-like concave and convex shape of the metal cover 20 and comes into contact in accordance with the enlarged surface area. Therefore, even if the adhering performance is held, the dynamical load due to the elastic deformation of the heat conduction elastomer 21 is reduced. At the same time, it is useful to raise a heat transfer efficiency. A hardness of the heat conduction elastomer 21 lies within a range from about 10° to 30°. In this instance, it is desirable to set the relation between a deformation amount x of the heat conduction elastomer 21 and a convex amount y of the metal cover 20 shown in FIG. 8 to values within a range from y=0.5x to y=0.2x.

Figure 11:
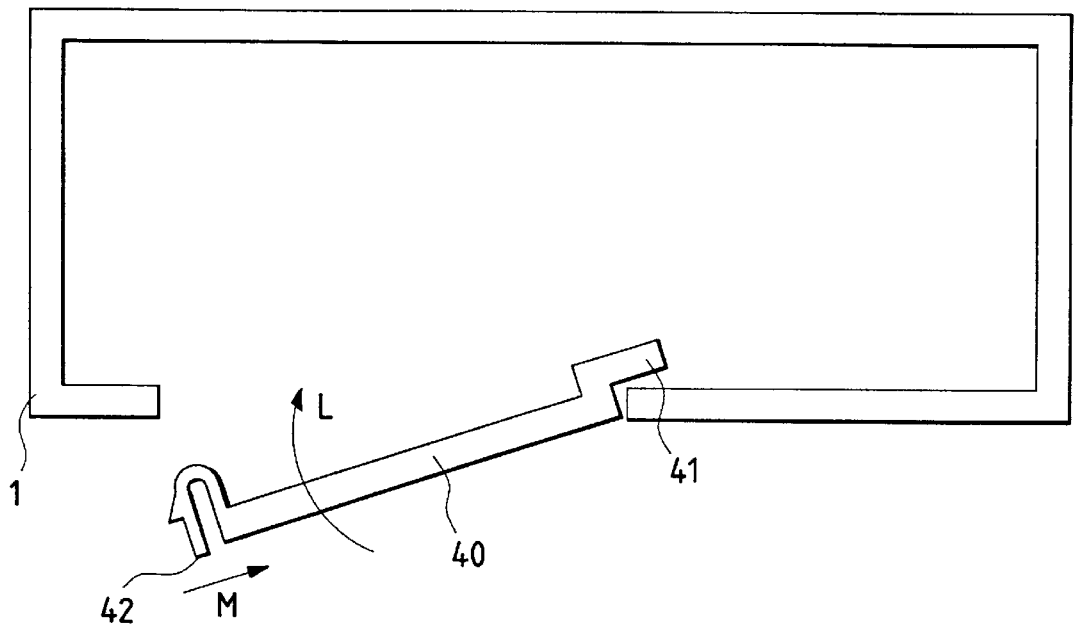
FIG. 11 is a cross sectional view of an apparatus according to an embodiment 3 of the invention.
Figure 12:
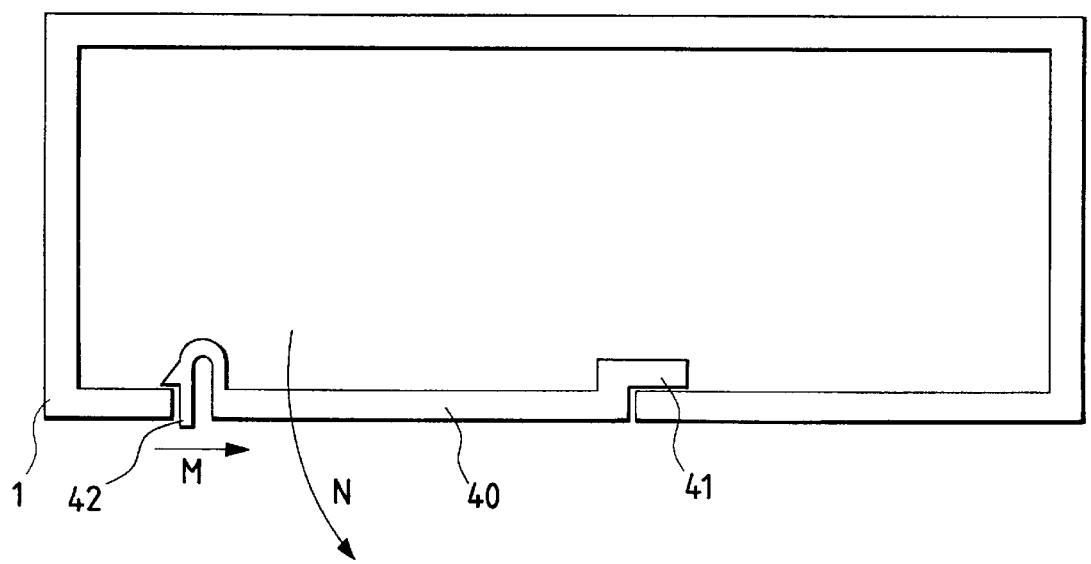
FIG. 12 is a cross sectional view of the embodiment 3 of the invention.

In the embodiments 1 and 2 described above, although the cover has been attached to the housing by fitting the connectors, as shown in FIG. 11, there is also a method whereby a hooking portion 41 and a latch portion 42 are provided for a cover 40 and are attached to the housing 1. In case of attaching, as shown in FIG. 11, the hooking portion 41 is hooked to the housing 1 and is used as a rotary axis and the cover 40 is rotated in the direction shown by an arrow L. Since the latch portion 42 has a structure such that it is elastically deformed in the direction shown by an arrow M, an attaching state of the latch portion 42 is as shown in FIG. 12. The cover 40 is locked to the housing 1. In case of removing, the latch portion 42 is deformed in the direction of the arrow M from the state of FIG. 12 and is unlocked and the cover 40 is rotated in the direction shown by an arrow N by using the hooking portion 41 as a rotary axis. In the case where the cover 40 needs a heat radiating performance, by forming the latch portion 41 by a resin and by forming the other portions by a metal, both of the above cover attaching function and the heat radiating performance can be accomplished.

As another attaching method, there is also a method of fixing the cover to the housing with screws or the like. According to this method, since the adhering performance of the cover and the housing is raised in particular, in the case where both of the cover and the housing are made of a metal, the heat diffusion from the chip is further promoted due to the good heat conductivity of them. It is very advantageous from a viewpoint of heat radiation.

As for the contact between the chip and the metal cover described in the embodiment 2, by using a grease or an adhesive agent having a good heat conductivity and a good viscosity in place of elastomer or by using a plate spring or the like made of a material such as a metal or the like with a good heat conductivity, in a manner similar to the above embodiments, even if an error of the attaching dimensions occurs, such an error is absorbed and the heat from the chip can be efficiently transferred to the cover. At this time, since there is considered a case where the cover is fairly heated due to the heat from the chip, a device such that a sheet made of a resin or the like is adhered to an outside exposed portion of the cover in order to avoid the hand is coming into direct contact with such a heat metal cover is also considered.

According to the invention as described above, the CPU board having the connector C and the cover which constructs a part or all of the housing of the apparatus and fixes the CPU board and is integrated with the CPU board can be attached/detached to/from the housing of the apparatus by only the motion in at least one fitting surface of the connectors. Therefore, when the CPU board is removed, the direction of the dynamic load which is applied to the connectors and their peripheral portions can be stabilized to only the direction that is necessary to insert or remove the connector. There is an advantage such that the durability and reliability for the insertion and removal of the connectors are not lost.

When the CPU board is fixed to the cover, by making the cover come into contact with the CPU chip as metal plate with a good heat conductivity, there are effects such that the heat conduction from the CPU chip to the cover is raised and the heat radiating surface is enlarged and the heat radiation of the CPU chip is promoted.

Further, the metal cover has a mountain-like concave/convex shaped cross section and the concave/convex shaped portion comes into contact with the CPU chip through the elastic heat conduction elastomer, so that there is an effect such that the dynamic load to the CPU chip and CPU board when they contact can be reduced.

What is claimed is:

1. An electronic apparatus comprising:
    a first board arranged within a casing and having a first connector;
    a cover forming part of said casing and detachable from said casing;
    a second board having a second connector adapted to be fitted to said first connector, said second board being fixed to said cover; and
    a heat generating member detachably mounted on said second board, wherein
    said second board is secured to said cover so as to detach therewith when said cover is detached from said casing.

2. An apparatus according to claim 1, wherein said cover is made of an electrically conductive material.

3. An apparatus according to claim 1, wherein said cover is made of a metal and is in contact with said heat generating member attached to said second board.

4. An apparatus according to claim 4, wherein said metal cover is in contact with said heat generating member attached to said second board through a heat conduction elastomer.

5. An apparatus according to claim 1, wherein said second board is smaller than said cover.

6. An apparatus according to claim 1, wherein said casing includes an opening, the opening being smaller in size than and covered by said cover.

7. An apparatus according to claim 1, wherein said second board is fixed in a substantially parallel manner to said cover.

8. An apparatus according to claim 1, wherein said first connector and said second connector are engaged when said cover is connected to said casing.

9. An information processing apparatus comprising:
    a first board on which a first connector and a CPU are installed;
    a cover to which said first board is fixed;
    a second board on which a second connector adapted to be fitted to said first connector and a plurality of ICs are installed; and
    a casing to which said second board is fixed, with said cover detachably forming part of said casing,
    wherein when said cover is attached to said casing said first and second connectors are fitted to each other, and wherein said first board is secured to said cover so as to detach therewith when said cover is detached from said casing.

10. An apparatus according to claim 9, wherein said first board is fixed to said cover so that said CPU is located between said first board and said cover.

11. An apparatus according to claim 10, wherein said CPU comes into contact with said cover through a heat radiating member.

12. An apparatus according to claim 11, wherein a center portion of said heat radiating member is thick and a peripheral portion thereof is thin.

13. An apparatus according to claim 12, wherein a portion of said cover which comes into contact with said heat radiating member has a concave portion and convex portion.

14. An apparatus according to claim 9, wherein in case of removing said cover from said casing, one end of said cover functions as a rotary axis.

15. An apparatus according to claim 14, wherein said first connector is installed on said first board at a position thereof near to the one end of said cover.

16. An apparatus according to claim 9, wherein said first connector is installed on said first board at a position offset from a center thereof near to one end of said cover.

17. An apparatus according to claim 14, wherein a groove is provided at the other end of said cover for opening said cover.

18. An apparatus according to claim 9, wherein said first board is smaller than said cover.

19. An apparatus according to claim 9, wherein said casing includes an opening, the opening being smaller in size than and covered by said cover.

20. An apparatus according to claim 9, wherein said first board is fixed in a substantially parallel manner to said cover.

* * * * *

UNITED STATES PATENT AND TRADEMARK OFFICE
CERTIFICATE OF CORRECTION

PATENT NO. : 6,002,587

DATED : December 14, 1999

INVENTOR(S): MUNENORI SHUSA, ET AL.

It is certified that error appears in the above-identified patent and that said Letters Patent is hereby corrected as shown below:

Title page, item
[73] ASSIGNEE:

"Toyko," should read --Tokyo,--.

COLUMN 6:

Line 20, "claim 4," should read --claim 3,--.

Signed and Sealed this

Twentieth Day of March, 2001

Attest:

NICHOLAS P. GODICI

*Attesting Officer*  *Acting Director of the United States Patent and Trademark Office*